(12) United States Patent
Wu et al.

(10) Patent No.: US 10,944,386 B1
(45) Date of Patent: Mar. 9, 2021

(54) FREQUENCY DOUBLER BASED ON PHASE FREQUENCY DETECTORS USING RISING EDGE DELAY

(71) Applicant: QUALCOMM Incorporated, San Diego, CA (US)

(72) Inventors: Jing Wu, San Diego, CA (US); Ying Duan, San Diego, CA (US); Zhi Zhu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/928,218

(22) Filed: Jul. 14, 2020

(51) Int. Cl.
*H03K 5/00* (2006.01)
*H03K 5/135* (2006.01)
*H03B 19/14* (2006.01)

(52) U.S. Cl.
CPC ......... *H03K 5/00006* (2013.01); *H03B 19/14* (2013.01); *H03K 5/135* (2013.01); *H03K 2005/00228* (2013.01)

(58) Field of Classification Search
None
See application file for complete search history.

(56) References Cited

U.S. PATENT DOCUMENTS

| | | | | |
|---|---|---|---|---|
| 7,187,221 B2* | 3/2007 | Kim | .......................... | H03L 7/07 327/175 |
| 7,439,787 B2* | 10/2008 | Hashim | ..................... | H03L 7/07 327/172 |
| 7,474,136 B2* | 1/2009 | Heightley | ............ | G11C 7/1051 327/158 |
| 2007/0176659 A1* | 8/2007 | Gomm | .................. | H03L 7/0805 327/175 |
| 2009/0243677 A1* | 10/2009 | Becker | ...................... | H03L 7/07 327/158 |
| 2009/0256629 A1* | 10/2009 | Tseng | ...................... | H03L 7/091 329/310 |
| 2009/0295441 A1* | 12/2009 | Kwak | ................... | H03L 7/0805 327/158 |
| 2012/0223754 A1* | 9/2012 | Lewis | ................... | H03L 7/0812 327/158 |
| 2013/0328606 A1* | 12/2013 | Ravi | .................... | H03K 5/1565 327/175 |
| 2016/0269012 A1* | 9/2016 | Takahashi | ............. | H03L 7/0814 |

* cited by examiner

*Primary Examiner* — Lincoln D Donovan
*Assistant Examiner* — Khareem E Almo
(74) *Attorney, Agent, or Firm* — Patterson & Sheridan, L.L.P

(57) ABSTRACT

Certain aspects of the present disclosure generally relate to techniques and apparatus for doubling the frequency of a signal. For example, certain aspects are directed to a phase frequency detector (PFD)-based rising-edge-delay-only frequency doubling circuit. One example frequency doubler circuit generally includes a first delay stage, a second delay stage, a first PFD, a first rising-edge-only adjustable delay cell, a second PFD, a second rising-edge-only adjustable delay cell a logic gate, and a comparator configured to compare a direct-current (DC) voltage value of an output of the logic gate with a reference voltage and control the first and second rising-edge-only adjustable delay cells based on the comparison.

20 Claims, 3 Drawing Sheets

FREQUENCY DOUBLER BASED ON PHASE FREQUENCY DETECTORS USING RISING EDGE DELAY

BACKGROUND

Field of the Disclosure

Certain aspects of the present disclosure generally relate to electronic circuits and, more particularly, to a frequency doubling circuit.

Description of Related Art

Electronic devices such as computers, smartphones, tablets, and wearable devices typically utilize different clocks signals having different frequencies. Rather than separately generating these multiple clock signals from different crystal oscillators, it is typically more cost effective and saves more space generating different clock signals from a single crystal oscillator, using a frequency synthesizer or other suitable clock generation and distribution circuits, for example. One example of such clock circuits is a frequency doubler, which receives an input clock signal having an input frequency (f) and generates an output clock signal having an output frequency at two times the input frequency (2f).

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include accurate clock signal frequency doubling capabilities using an adjustable delay cell designed to be very linear and have a fine resolution for only the rising edge delay.

Certain aspects of the present disclosure generally relate to a frequency doubler. For certain aspects, the frequency doubler is a phase frequency detector (PFD)-based rising-edge-delay-only frequency doubler.

Certain aspects of the present disclosure provide a frequency doubler. The frequency doubler generally includes a first delay stage having an input coupled to an input node of the frequency doubler and a second delay stage having an input coupled to the input node. The frequency doubler also generally includes a first PFD having a first input coupled to an output of the first delay stage, a first rising-edge-only adjustable delay cell having an input coupled to the output of the first delay stage and having an output coupled to a second input of the first PFD, a second PFD having a first input coupled to an output of the second delay stage, and a second rising-edge-only adjustable delay cell having an input coupled to the output of the second delay stage and having an output coupled to a second input of the second PFD. Additionally, the frequency doubler generally includes a logic gate having a first input coupled to an output of the first PFD and having a second input coupled to an output of the second PFD. The frequency doubler generally also includes a comparator configured to compare a direct-current (DC) voltage value of an output of the logic gate with a reference voltage and to control the first and second rising-edge-only adjustable delay cells based on the comparison.

Certain aspects of the present disclosure provide a half rate clock generator. The half rate clock generator generally includes the frequency doubler described herein.

Certain aspects of the present disclosure are directed to a method for doubling a frequency of an input clock signal. The method generally includes delaying the input clock signal by a first delay to generate a delayed clock signal; inverting and delaying the input clock signal by a second delay to generate a complementary delayed clock signal; applying a first adjustable delay to rising edges only of the delayed clock signal to generate a first rising-edge-delayed clock signal; applying a second adjustable delay to rising edges only of the complementary delayed clock signal to generate a second rising-edge-delayed clock signal; determining differences between rising edges of the delayed clock signal and the first rising-edge-delayed clock signal to generate a first rising-edge-difference signal; determining differences between rising edges of the complementary delayed clock signal and the second rising-edge-delayed clock signal to generate a second rising-edge-difference signal; combining the first and second rising-edge-difference signals to generate a combined signal; comparing a DC voltage value of the combined signal with a reference voltage; and controlling the first adjustable delay and the second adjustable delay based on the comparison.

Certain aspects of the present disclosure provide an apparatus for doubling a frequency of an input clock signal. The apparatus generally includes means for delaying the input clock signal by a first delay to generate a delayed clock signal; means for inverting and delaying the input clock signal by a second delay to generate a complementary delayed clock signal; means for applying a first adjustable delay to rising edges only of the delayed clock signal to generate a first rising-edge-delayed clock signal; means for applying a second adjustable delay to rising edges only of the complementary delayed clock signal to generate a second rising-edge-delayed clock signal; means for determining differences between rising edges of the delayed clock signal and the first rising-edge-delayed clock signal to generate a first rising-edge-difference signal; means for determining differences between rising edges of the complementary delayed clock signal and the second rising-edge-delayed clock signal to generate a second rising-edge-difference signal; means for combining the first and second rising-edge-difference signals to generate a combined signal; means for comparing a DC voltage value of the combined signal with a reference voltage; and means for controlling the first adjustable delay and the second adjustable delay based on the comparison.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure generally relate to techniques and apparatus for doubling the frequency of a signal. For example, certain aspects are directed to a phase frequency detector (PFD)-based rising-edge-delay-only frequency doubling circuit.

Example Frequency Doubling Circuit

Conventionally, a frequency doubling circuit may demand a very linear and fine resolution delay cell for both the rising and falling edge delays. However, such delay cells may be very challenging and/or costly to design or implement. For example, a current starving or sourcing delay cell may be mostly effective for only rising edge delay or falling edge delay, but not both rising and falling edge delays.

Accordingly, certain aspects of the present disclosure provide techniques and apparatus for doubling a frequency of an input signal using multiple PFDs to implement a rising-edge-only delay.

Figure 1:
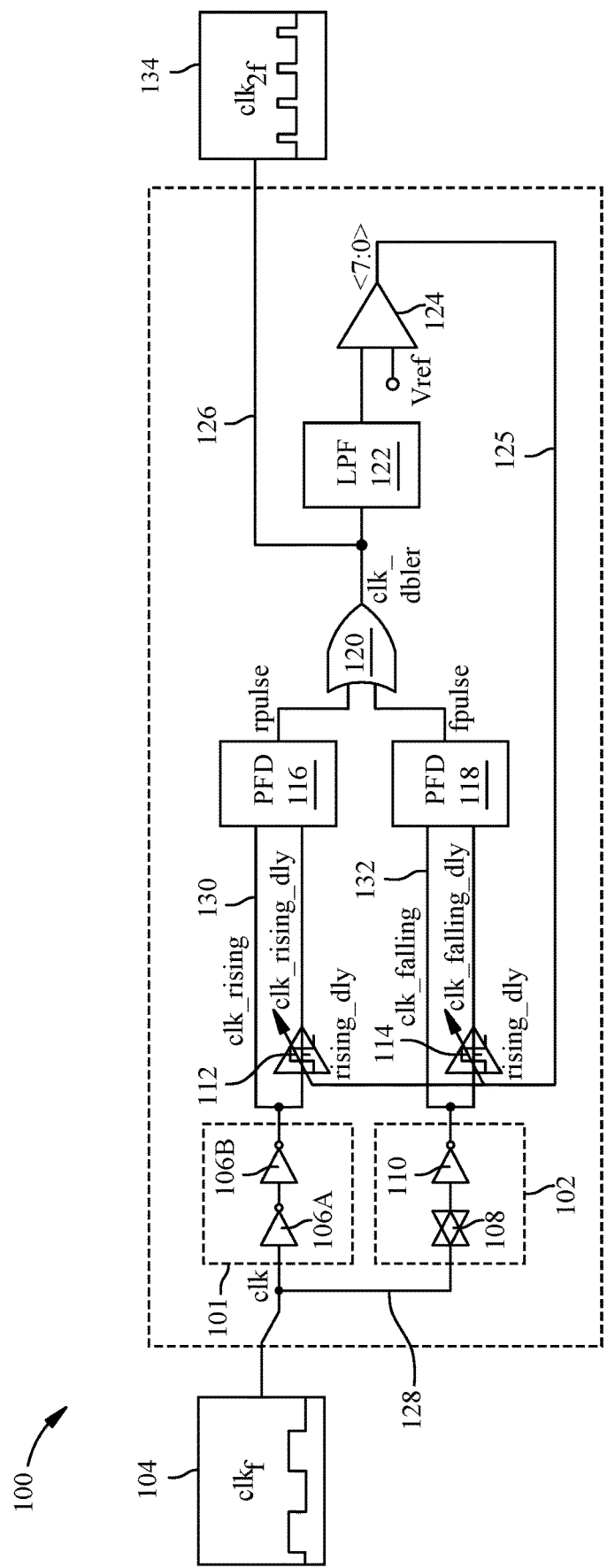
FIG. 1 illustrates an exemplary frequency doubling circuit, in accordance with certain aspects of the present disclosure.

FIG. 1 illustrates an exemplary frequency doubling circuit 100 (also referred to as a "frequency doubler") configured to double the frequency of an input signal, in accordance with certain aspects of the present disclosure. For example, the circuit 100 may receive an input clock signal 104 with a first frequency (f) and generate an output clock signal 134 with a second frequency at two times the first frequency (2f). The input clock signal 104 may be generated by a phase-locked loop (PLL) of a frequency synthesizer, for example. The output clock signal 134 may have a 50% duty cycle or any other desired duty cycle. The frequency doubling circuit 100 may include a first delay stage 101, a second delay stage 102, a first delay cell 112, a second delay cell 114, a first phase frequency detector (PFD) 116, and a second PFD 118. The frequency doubling circuit 100 may further include a logic gate 120, a filter 122, and a comparator 124.

The first delay stage 101 may be coupled between an input node 128 of the circuit 100 and node 130. The first delay stage 101 may be implemented, for example, by multiple series-connected inverters, such as inverters 106A, 106B (collectively referred to as "inverters 106"), where each inverter contributes to a delay of the input clock signal 104. The first delay stage 101 may have an even number of inverters (e.g., two inverters), such that the output signal (labeled "clk_rising") from the first delay stage may be a delayed version of the input clock signal 104, having corresponding rising edges.

The second delay stage 102 may be coupled between the input node 128 and node 132. The second delay stage 102 may be implemented, for example, by a transmission gate 108 connected in series with an inverter 110, as illustrated in FIG. 1. The combination of the transmission gate 108 and the inverter 110 may delay and invert the input clock signal 104. The transmission gate 108 may have a similar delay to the delay of the inverter 110 and may be implemented with the same technology as the inverter (e.g., a complementary metal-oxide-semiconductor (CMOS) delay element and CMOS inverter). The second delay stage 102 may have an odd number of inverters (e.g., one inverter)—which may be one less than the number of inverters in the first delay stage 101—such that the output signal (labeled "clk_falling") from the second delay stage may be a delayed, inverted version of the input clock signal 104, having falling edges corresponding to rising edges of the clk_rising signal and having rising edges corresponding to falling edges of the clk_rising signal, as depicted in the timing diagram 200 of FIG. 2. In other words, clk_rising and clk_falling may be complementary signals.

The output of the first delay stage 101 may be coupled to a first input of the first PFD 116 via node 130 and to the first delay cell 112 via node 130. The first delay cell 112 may be an adjustable delay cell, which in some cases, may be a rising-edge-only adjustable delay cell, meaning that the delay cell applies an adjustable delay (labeled "rising_dly") only to rising edges of an input signal (e.g., clk_rising), but falling edges of the input signal remain unchanged, to generate a rising-edge-only-delayed output signal (labeled "elk_rising_dly"). The output of the first delay cell 112 is coupled to a second input of the first PFD 116.

Similarly, the output of the second delay stage 102 may be coupled to a first input of the second PFD 118 via node 132 and to the second delay cell 114 via node 132. The second delay cell 114 may be an adjustable delay cell, which in some cases, may be a rising-edge-only adjustable delay cell, applying an adjustable delay (labeled "rising_dly") only to rising edges of an input signal (e.g., clk_falling) to generate a rising-edge-only-delayed output signal (labeled "clk_falling_dly"). The output of the second delay cell 114 is coupled to a second input of the second PFD 118.

The first PFD 116 may be configured to determine a phase difference between the signal on the first input (e.g., clk_rising) and the delayed signal on the second input (e.g., clk_rising_dly). The output signal (labeled "rpulse") from the first PFD 116 represents this phase difference (e.g., the difference in timing between respective rising edges of clk_rising and clk_rising_dly) and may be considered as a series of rising-edge-difference pulses.

Likewise, the second PFD 118 may be configured to determine a phase difference between the signal on the first input (e.g., clk_falling) and the delayed signal on the second input (e.g., clk_falling_dly). The output signal (labeled "fpulse") from the second PFD 118 represents this phase difference (e.g., the difference in timing between respective rising of clk_falling and clk_falling_dly) and may be considered as a series of rising-edge-difference pulses.

The outputs of the first PFD 116 and the second PFD 118 may be coupled to inputs of the logic gate 120. The logic gate 120 may, for example, be an OR gate, an exclusive OR (XOR) gate, or any other suitable logic gate type. In certain aspects, the logic gate may be replaced by a logic circuit (e.g., with multiple logic gates) configured to perform logic operations on at least the signals rpulse and fpulse. The logic gate 120 may be configured to provide an output signal (labeled "clk_dbler") to the output node 126, such that the output of the logic gate 120 may provide the output clock signal 134 for the frequency doubling circuit 100. In certain aspects, the output clock signal 134 (clk$_{2f}$) may have a frequency twice the frequency of the input clock signal 104 (clk$_f$).

The output of the logic gate 120 may also be coupled to an input of the filter 122. In certain aspects, the filter 122 may be a low-pass filter and may be implemented by one or more resistive-capacitive stages. In this case, the output signal (clk_dbler) from the logic gate 120 may be converted to a DC value via the filter 122 according to the duty cycle of the clk_dbler signal. The output of the filter 122 may be coupled to a first input of the comparator 124, whereas the second input of the comparator is coupled to node having a reference voltage (Vref). For example, Vref may be 0.5Vdd, where Vdd is a power rail voltage for powering various components, such as the logic gate 120 (and the comparator 124). In certain aspects, Vref may be greater than 0.5Vdd, or, alternatively, less than 0.5Vdd, depending on the desired duty cycle of the clk_dbler signal.

The comparator 124 may be further configured to output a control signal (labeled "rising_dly") via control lines 125 (e.g., a control bus), such that the output of the comparator is coupled to control inputs of the first delay cell 112 and the second delay cell 114. The output of comparator 124 may be 8 bits, as illustrated in FIG. 1. In other aspects, the output of the comparator 124 may be any of various suitable bit lengths. The value of the control signal is a function of the difference between the filtered input from the 122 and Vref (which may represent a difference in the duty cycles between the clk_dbler signal and the representative duty cycle of Vref). For example, the first input may be 0.45Vdd (representing a clk_dbler duty cycle of 45%), while Vref=0.5Vdd (representing a desired duty cycle of 50%). The difference may lead to the comparator 124 adjusting the value of the control signal to cause an increase in duty cycle of the clk_dbler signal (e.g., by increasing the adjustable delay of the first and second delay cells 112, 114). In this manner, the filter 122, the comparator 124, and the adjustable delay cells act as a feedback mechanism for the frequency doubling circuit 100.

Figure 2:
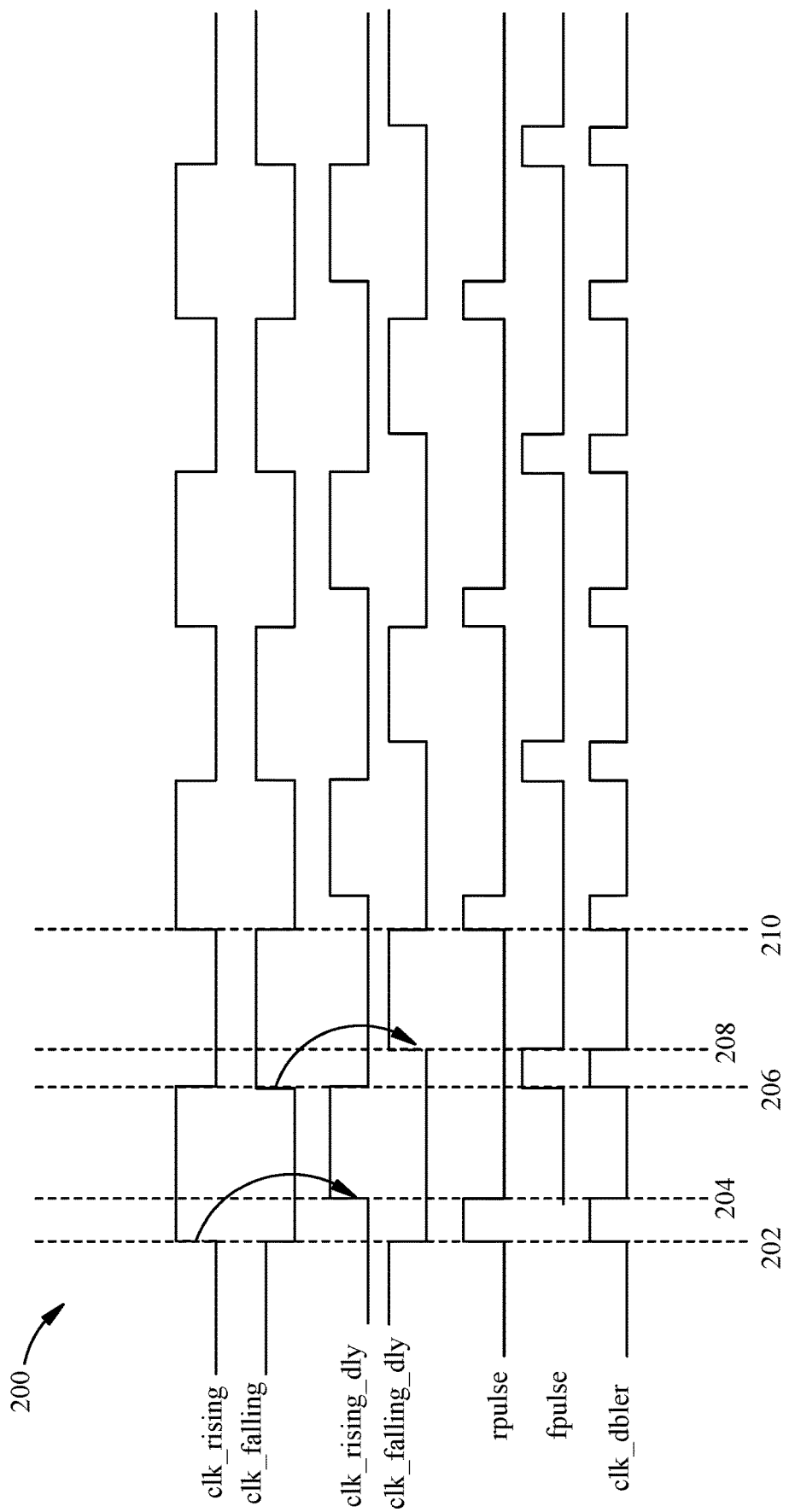
FIG. 2 is a timing diagram illustrating signal waveforms for the frequency doubling circuit of FIG. 1, in accordance with certain aspects of the present disclosure.

FIG. 2 is a timing diagram 200 illustrating various signal waveforms for the frequency doubling circuit 100 of FIG. 1, in accordance with certain aspects of the present disclosure. As shown, the clk_rising signal is shown to have a duty cycle of approximately 50% with a particular frequency (f). As shown, the clk_falling signal is the inverted version of the clk_rising signal. The clk_falling signal may be generated through inversion (and delay) of the input clock signal 104 via the second delay stage 102 (e.g., inverter 110).

As shown, the elk_rising_dly signal has the same falling edge timing as the clk_rising signal (e.g., time 206). However, the elk_rising_dly signal has a rising edge occurring later (e.g., time 204) than the rising edge of the elk_rising signal (e.g., time 202). Furthermore, as shown, the elk_falling_dly signal has the same falling edge timing as the clk_falling signal (e.g., time 210). However, the elk_falling_dly signal has a rising edge occurring later (e.g., time 208) than the rising edge of the clk_falling signal (e.g., time 206).

As shown, the rpulse signal represents the difference between rising edges (e.g., time 202 to time 204) of the clk_rising and elk_rising_dly signals as determined by the first PFD 116. Similarly, as shown, the fpulse signal represents the difference between rising edges (e.g., time 206 to time 208) of the clk_falling and elk_falling_dly signals as determined by the second PFD 118.

As shown, the elk_dbler signal may represent an output of performing logical operations (OR or XOR) on the rpulse and fpulse signals, such that the rpulse and fpulse signals may be effectively combined. In this manner, the elk_dbler signal has a frequency twice the frequency of the clk_rising signal.

Example Methods of Frequency Doubling

Figure 3:
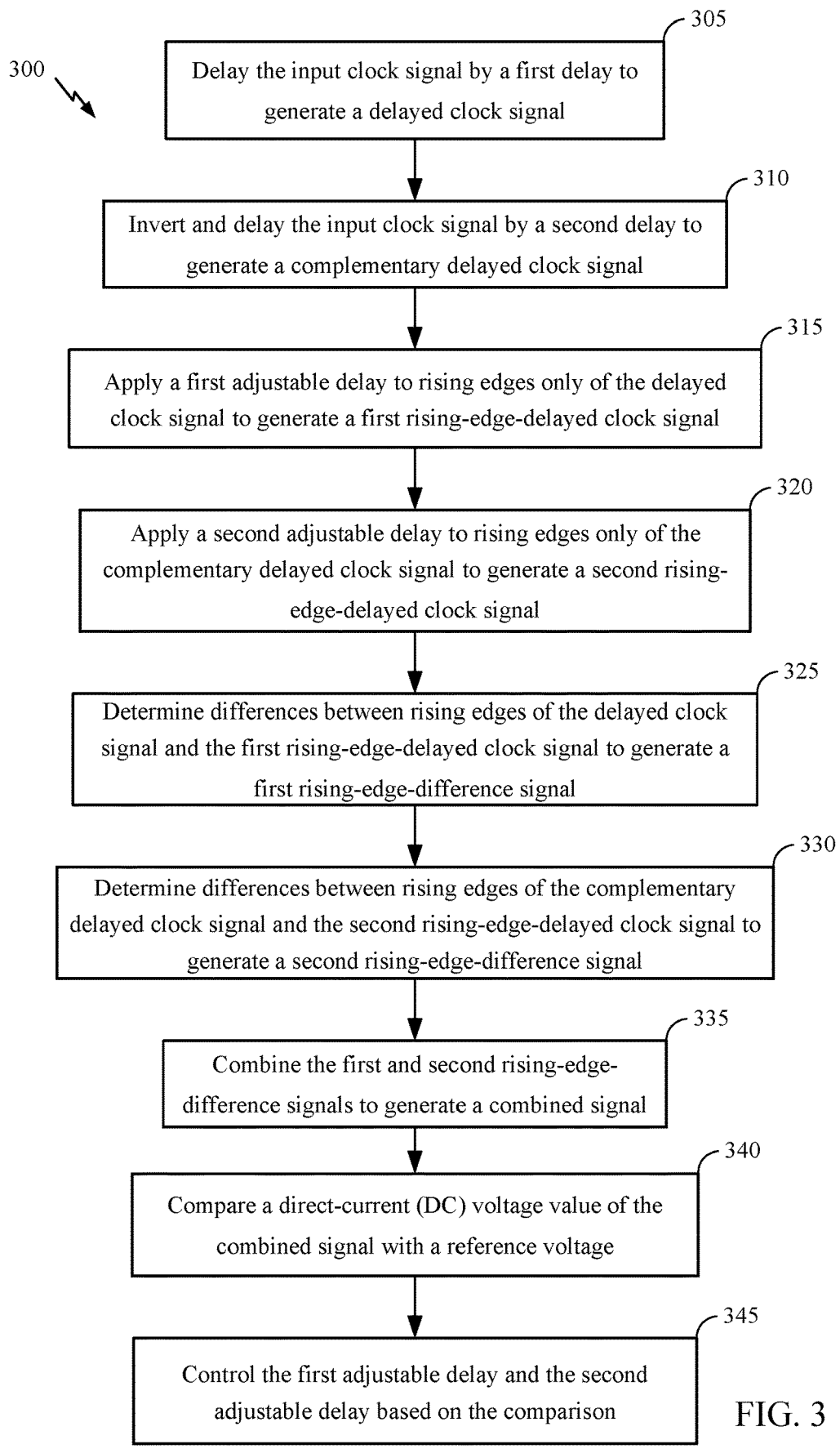
FIG. 3 is flow diagram of exemplary operations for doubling the frequency of a clock signal, in accordance with certain aspects of the present disclosure.

FIG. 3 is a flow diagram of exemplary operations 300 for doubling the frequency of an input clock signal, in accordance with certain aspects of the present disclosure. The operations 300 may be performed by a frequency doubler, such as the frequency doubling circuit 100 of FIG. 1.

The operations 300 may begin, at block 305, with the frequency doubler delaying the input clock signal (e.g., input clock signal 104) by a first delay (e.g., via the first delay stage 101) to generate a delayed clock signal (e.g., clk_rising). At block 310, the frequency doubler may invert and delay the input clock signal by a second delay (e.g., via the second delay stage 102) to generate a complementary delayed clock signal (e.g., clk_falling).

At block 315, the frequency doubler may apply a first adjustable delay (e.g., rising_dly with first delay cell 112) to rising edges only of the delayed clock signal to generate a first rising-edge-delayed clock signal (e.g., elk_rising_dly). At block 320, the frequency doubler may apply a second adjustable delay (e.g., rising_dly with second adjustable delay cell 114) to rising edges only of the complementary delayed clock signal to generate a second rising-edge-delayed clock signal (e.g., clk_falling_dly).

At block 325, the frequency doubler may determine differences between rising edges of the delayed clock signal and the first rising-edge-delayed clock signal (e.g., via first PFD 116) to generate a first rising-edge-difference signal (e.g., rpulse). At block 330, the frequency doubler may determine differences between rising edges of the complementary delayed clock signal and the second rising-edge-delayed clock signal (e.g., via second PFD 118) to generate a second rising-edge-difference signal (e.g., fpulse).

The frequency doubler may combine the first and second rising-edge-difference signals at block 335 to generate a combined signal (e.g., clk_dbler). The combined signal may have a frequency twice that of the input clock signal. In certain aspects, the combined signal has a duty cycle of 50%.

For certain aspects, the frequency doubler compares a direct-current (DC) voltage value of the combined signal with a reference voltage (e.g., 0.5*Vdd) at block 340. In this case, the frequency doubler may control the first adjustable delay and/or the second adjustable delay based on the comparison (e.g., with comparator 124) at block 345.

According to certain aspects, delaying the input clock signal by the first delay at block 305 may entail inverting the input clock signal and inverting the inverted clock signal to generate the delayed clock signal. For example, the input clock signal 104 may be processed by both of the inverters 106. For certain aspects, inverting and delaying the input clock signal by the second delay at block 310 involves delaying the input clock signal with a transmission gate and inverting the delayed input clock signal to generate the complementary delayed clock signal. For example, the input clock signal 104 may be processed by the transmission gate 108 and the inverter 110.

According to certain aspects determining the differences between the rising edges of the delayed clock signal and the first rising-edge-delayed clock signal at block 325 includes using a first PFD (e.g., first PFD 116) to generate the first rising-edge-difference signal (e.g., rpulse) from the delayed clock signal (e.g., clk_rising) and the first rising-edge-delayed clock signal (e.g., clk_rising_dly). In certain aspects, determining the differences between the rising edges of the complementary delayed clock signal and the second rising-edge-delayed clock signal at block 430 involves using a second PFD (e.g., second PFD 118) to generate the second rising-edge-difference signal (e.g., fpulse) from the complementary delayed clock signal (e.g., clk_falling) and the second rising-edge-delayed clock signal (e.g., clk_falling_dly).

According to certain aspects, combining the first and second rising-edge-difference signals at block 335 entails using an XOR logic gate (e.g., logic gate 120) to generate the combined signal (e.g., clk_dbler) from the first and second rising-edge-difference signals.

According to certain aspects, the operations 300 may further include low-pass filtering (e.g., with filter 122) the combined signal to generate the DC voltage value of the combined signal.

CONCLUSION

Certain aspects of the present disclosure provide a frequency doubler, which may be a PFD-based rising-edge-delay-only frequency doubler. Such a frequency doubler may detect the edge difference between two delayed signals with a PFD, combine (e.g., add) the rising-edge-delayed PFD result with the falling-edge-delayed PFD result, take the DC value (with a low-pass filter) of the combined signal, and compare this DC value with a voltage reference (Vdd/2). The frequency doubler may then adjust the rising edge delay based on the comparison. In this manner, the frequency doubler may work with high performance in a rising-edge-delay-only environment and may use a delay cell designed to be very linear and have a fine resolution on only the rising edge, rather than both the rising and falling edges.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example. For example, means for delaying may include a delay element, such as an inverter (e.g., inverters 106 or inverter 110, as illustrated in FIG. 1), a transmission gate (e.g., transmission gate 108 as depicted in FIG. 1), or a delay cell (e.g., first delay cell 112 or second delay cell 114 as shown in FIG. 1). Means for inverting may include an inverter (e.g., inverters 106 or inverter 110, as portrayed in FIG. 1). Means for applying a delay may include a delay cell (e.g., first delay cell 112 or second delay cell 114 as shown in FIG. 1). Means for determining differences may include a phase detector, such as a phase frequency detector (PFD) (e.g., first PFD 116 or second PFD 118 as illustrated in FIG. 1). Means for combining may include a combiner, an adder, or a logic gate (e.g., logic gate 122 as depicted in FIG. 1). Means for comparing may include a comparator (e.g., comparator 124 as portrayed in FIG. 1). Means for controlling may include one or more control signals sent on one or more control lines (e.g., control lines 125 with rising_dly signals, as shown in FIG. 1). Means for generating may comprise any of various suitable circuits for setting a voltage, such as a reference voltage generator, a Zener diode, a voltage divider, a buffer, a voltage regulator, and the like.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A frequency doubler comprising:
a first delay stage having an input coupled to an input node of the frequency doubler;
a second delay stage having an input coupled to the input node;
a first phase frequency detector (PFD) having a first input coupled to an output of the first delay stage;
a first rising-edge-only adjustable delay cell having an input coupled to the output of the first delay stage and having an output coupled to a second input of the first PFD;
a second PFD having a first input coupled to an output of the second delay stage;
a second rising-edge-only adjustable delay cell having an input coupled to the output of the second delay stage and having an output coupled to a second input of the second PFD;
a logic gate having a first input coupled to an output of the first PFD and having a second input coupled to an output of the second PFD; and
a comparator configured to:
compare a direct-current (DC) voltage value of an output of the logic gate with a reference voltage; and
control the first and second rising-edge-only adjustable delay cells based on the comparison.

2. The frequency doubler of claim 1, further comprising a low-pass filter having an input coupled to the output of the logic gate and an output coupled to an input of the comparator, the low-pass filter being configured to generate the DC value of the output of the logic gate.

3. The frequency doubler of claim 1, wherein the logic gate comprises an exclusive OR (XOR) logic gate.

4. The frequency doubler of claim 1, wherein the first delay stage comprises:
a first inverter having an input coupled to the input node; and
a second inverter having an input coupled to an output of the first inverter and having an output coupled to the output of the first delay stage.

5. The frequency doubler of claim 4, wherein the second delay stage comprises a transmission gate and an inverter.

6. The frequency doubler of claim 5, wherein:
an input of the transmission gate is coupled to the input node;
an output of the transmission gate is coupled to an input of the inverter; and
an output of the inverter is coupled to the output of the second delay stage.

7. The frequency doubler of claim 1, wherein the reference voltage is one half of a power rail voltage for powering the logic gate.

8. The frequency doubler of claim 1, wherein an output of the comparator is coupled to a control input of the first rising-edge-only adjustable delay cell and to a control input of the second rising-edge-only adjustable delay cell.

9. The frequency doubler of claim 1, wherein the output of the comparator comprises an 8-bit output.

10. The frequency doubler of claim 1, wherein the output of the logic gate is an output node of the frequency doubler.

11. A half rate clock generator comprising the frequency doubler of claim 1.

12. A method of doubling a frequency of an input clock signal, the method comprising:
delaying the input clock signal by a first delay to generate a delayed clock signal;
inverting and delaying the input clock signal by a second delay to generate a complementary delayed clock signal;
applying a first adjustable delay to rising edges only of the delayed clock signal to generate a first rising-edge-delayed clock signal;
applying a second adjustable delay to rising edges only of the complementary delayed clock signal to generate a second rising-edge-delayed clock signal;
determining differences between rising edges of the delayed clock signal and the first rising-edge-delayed clock signal to generate a first rising-edge-difference signal;
determining differences between rising edges of the complementary delayed clock signal and the second rising-edge-delayed clock signal to generate a second rising-edge-difference signal;
combining the first and second rising-edge-difference signals to generate a combined signal;
comparing a direct-current (DC) voltage value of the combined signal with a reference voltage; and
controlling the first adjustable delay and the second adjustable delay based on the comparison.

13. The method of claim 12, wherein delaying the input clock signal by the first delay comprises inverting the input clock signal and inverting the inverted clock signal to generate the delayed clock signal.

14. The method of claim 13, wherein inverting and delaying the input clock signal by the second delay comprises delaying the input clock signal with a transmission gate and inverting the delayed input clock signal to generate the complementary delayed clock signal.

15. The method of claim 12, wherein:
determining the differences between the rising edges of the delayed clock signal and the first rising-edge-delayed clock signal comprises using a first phase frequency detector (PFD) to generate the first rising-edge-difference signal from the delayed clock signal and the first rising-edge-delayed clock signal; and
determining the differences between the rising edges of the complementary delayed clock signal and the second rising-edge-delayed clock signal comprises using a second PFD to generate the second rising-edge-difference signal from the complementary delayed clock signal and the second rising-edge-delayed clock signal.

16. The method of claim 12, wherein combining the first and second rising-edge-difference signals comprises using an exclusive OR (XOR) logic gate to generate the combined signal from the first and second rising-edge-difference signals.

17. The method of claim 12, further comprising low-pass filtering the combined signal to generate the DC voltage value of the combined signal.

18. The method of claim 12, wherein the combined signal has a duty cycle of 50% and a frequency that is twice that of the input clock signal.

19. An apparatus for doubling a frequency of an input clock signal, the apparatus comprising:

means for delaying the input clock signal by a first delay to generate a delayed clock signal;

means for inverting and delaying the input clock signal by a second delay to generate a complementary delayed clock signal;

means for applying a first adjustable delay to rising edges only of the delayed clock signal to generate a first rising-edge-delayed clock signal;

means for applying a second adjustable delay to rising edges only of the complementary delayed clock signal to generate a second rising-edge-delayed clock signal;

means for determining differences between rising edges of the delayed clock signal and the first rising-edge-delayed clock signal to generate a first rising-edge-difference signal;

means for determining differences between rising edges of the complementary delayed clock signal and the second rising-edge-delayed clock signal to generate a second rising-edge-difference signal;

means for combining the first and second rising-edge-difference signals to generate a combined signal;

means for comparing a direct-current (DC) voltage value of the combined signal with a reference voltage; and means for controlling the first adjustable delay and the second adjustable delay based on the comparison.

20. The apparatus of claim 19, further comprising means for generating the DC voltage value of the combined signal.

\* \* \* \* \*